United States Patent
Miller et al.

(10) Patent No.: US 10,692,776 B2
(45) Date of Patent: Jun. 23, 2020

(54) FORMATION OF VTFET FIN AND VERTICAL FIN PROFILE

(71) Applicant: INTERNATIONAL BUSINESS MACHINES CORPORATION, Armonk, NY (US)

(72) Inventors: Eric R. Miller, Watervliet, NY (US); Marc Bergendahl, Rensselaer, NY (US); Kangguo Cheng, Schenectady, NY (US); Yann Mignot, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/181,977

(22) Filed: Nov. 6, 2018

(65) Prior Publication Data

US 2020/0144131 A1    May 7, 2020

(51) Int. Cl.
| | |
|---|---|
| *H01L 21/8238* | (2006.01) |
| *H01L 27/092* | (2006.01) |
| *H01L 29/78* | (2006.01) |
| *H01L 29/66* | (2006.01) |

(52) U.S. Cl.
CPC ........ *H01L 21/823814* (2013.01); *H01L 21/823864* (2013.01); *H01L 21/823885* (2013.01); *H01L 27/092* (2013.01); *H01L 29/66795* (2013.01); *H01L 29/785* (2013.01)

(58) Field of Classification Search
CPC ..... H01L 21/823814; H01L 21/823885; H01L 27/092; H01L 21/823864; H01L 29/66795; H01L 29/785
See application file for complete search history.

(56) References Cited

U.S. PATENT DOCUMENTS

| 9,647,112 B1 | 5/2017 | Balakrishnan et al. |
| 9,837,410 B1 | 12/2017 | Cheng |
| 9,899,526 B2 | 2/2018 | Chiu et al. |

(Continued)

OTHER PUBLICATIONS

Anonymous, "Fabrication Method of a Dual-Gate Superlattice Vertical-FET (SL-VFET) Exhibiting Sub-60mV/dec Sub-Threshold Slope", An IP.com Prior Art Database Technical Disclosure, Aug. 21, 2017, 9 pages.

*Primary Examiner* — Patricia D Reddington
(74) *Attorney, Agent, or Firm* — Tutunjian & Bitetto, P.C.; Vazken Alexanian

(57) ABSTRACT

A semiconductor device includes etching fins into a bulk substrate in an active region, the bulk substrate including an intermediate layer formed over a base layer and a first semiconductor layer formed over the intermediate layer such that the fins extend through the first semiconductor layer into the intermediate layer to form tapered bottom portions of the fins within the intermediate layer and vertical fin sidewalls of a semiconductor portions of the fins within the first semiconductor layer. A second semiconductor layer is formed around the tapered bottom portions below the semiconductor portions of the fins such that the second semiconductor layer covers the tapered bottom portions to form a top surface proximal to the semiconductor portions of the fins that is substantially parallel to a bottom surface of the top surface of the base layer. A gate structure is formed around the fins.

16 Claims, 11 Drawing Sheets

(56) References Cited

U.S. PATENT DOCUMENTS

| | | | |
|---|---|---|---|
| 2015/0137193 A1* | 5/2015 | Cheng | H01L 29/7842 |
| | | | 257/288 |
| 2017/0033103 A1 | 2/2017 | Cheng et al. | |
| 2017/0288056 A1 | 10/2017 | Balakrishnan et al. | |
| 2018/0083139 A1 | 3/2018 | Mochizuki et al. | |
| 2018/0090494 A1 | 3/2018 | Chao et al. | |

* cited by examiner

Etching fins into a bulk substrate in an active region, the active region including a first region and a second region, the bulk substrate including an intermediate layer formed over a base layer and a semiconductor layer formed over the intermediate layer such that the fins extend through the semiconductor layer into the intermediate layer to form tapered bottom portions of the fins within the intermediate layer and vertical fin sidewalls of a semiconductor portions of the fins within the semiconductor layer
2001.

Growing second semiconductor layer from the tapered bottom portions below the semiconductor portions of the fins in the first region
2002.

Growing third semiconductor layer from the tapered bottom portions below the semiconductor portions of the fins in the second region such that the first semiconductor layer and the second semiconductor layer have respective top surfaces proximal to the semiconductor portions of the fins that is substantially parallel to a top surface of the base layer
2003.

Forming a first gate structure over the fins in the first region to form first field effect transistors (FET)
2004

Forming a second gate structure over the fins in the second region to form second FETs
2005

FIG. 20

FORMATION OF VTFET FIN AND VERTICAL FIN PROFILE

BACKGROUND

Technical Field

The present invention generally relates to forming semiconductor fins, and more particularly to forming vertical transport field effect transistors (VTFET) with vertical fin profiles.

Description of the Related Art

Forming fins from semiconductors can be limited at small sizes. Distortion and irregularity of the fin can be a problem, such as misshapen bottom regions of the fins. These distortions are more pronounced where the bottom source and drain structures are formed. Such distortions and irregularities introduce variations in device quality and transistor performance. Thus, device yields and error rates can be impaired.

SUMMARY

In accordance with an embodiment of the present invention, a method for forming a semiconductor device is described. The method includes etching fins into a bulk substrate in an active region, the bulk substrate including an intermediate layer formed over a base layer and a first semiconductor layer formed over the intermediate layer such that the fins extend through the first semiconductor layer into the intermediate layer to form tapered bottom portions of the fins within the intermediate layer and vertical fin sidewalls of a semiconductor portions of the fins within the first semiconductor layer. A second semiconductor layer is formed around the tapered bottom portions below the semiconductor portions of the fins such that the second semiconductor layer covers the tapered bottom portions to form a top surface proximal to the semiconductor portions of the fins that is substantially parallel to a bottom surface of the top surface of the base layer. A gate structure is formed around the fins.

In accordance with another embodiment of the present invention, a method for forming a semiconductor device is described. The method includes etching fins into a bulk substrate in an active region, the active region including a first region and a second region, the bulk substrate including an intermediate layer formed over a base layer and a first semiconductor layer formed over the intermediate layer such that the fins extend through the first semiconductor layer into the intermediate layer to form tapered bottom portions of the fins within the intermediate layer and vertical fin sidewalls of a semiconductor portions of the fins within the first semiconductor layer. A second semiconductor layer is grown from the tapered bottom portions below the semiconductor portions of the fins in the first region. A third semiconductor layer is grown from the tapered bottom portions below the semiconductor portions of the fins in the second region such that the first semiconductor layer and the second semiconductor layer have respective top surfaces proximal to the semiconductor portions of the fins that is substantially parallel to a top surface of the base layer. A first gate structure is formed over the fins in the first region to form first field effect transistors (FET). A second gate structure is formed around the fins in the second region to form second FETs.

In accordance with another embodiment of the present invention, a semiconductor device is described. The device includes fins formed in a bulk substrate in an active region, the bulk substrate including an intermediate layer disposed over a base layer and a first semiconductor layer formed over the intermediate layer such that the fins extend through the first semiconductor layer into the intermediate layer to form tapered bottom portions of the fins within the intermediate layer and vertical fin sidewalls of a semiconductor portions of the fins within the first semiconductor layer. A second semiconductor layer formed around the tapered bottom portions of the fins below the semiconductor portions of the fins such that the second semiconductor layer covers the tapered bottom portions to form a top surface proximal to the semiconductor portions of the fins that is substantially parallel to a bottom surface of the top surface of the base layer. A gate structure is disposed over the fins.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 20 is a block/flow diagram showing a system/method of forming a semiconductor device with vertical fin profiles, in accordance with an embodiment of the present invention.

DETAILED DESCRIPTION

Figure 1:
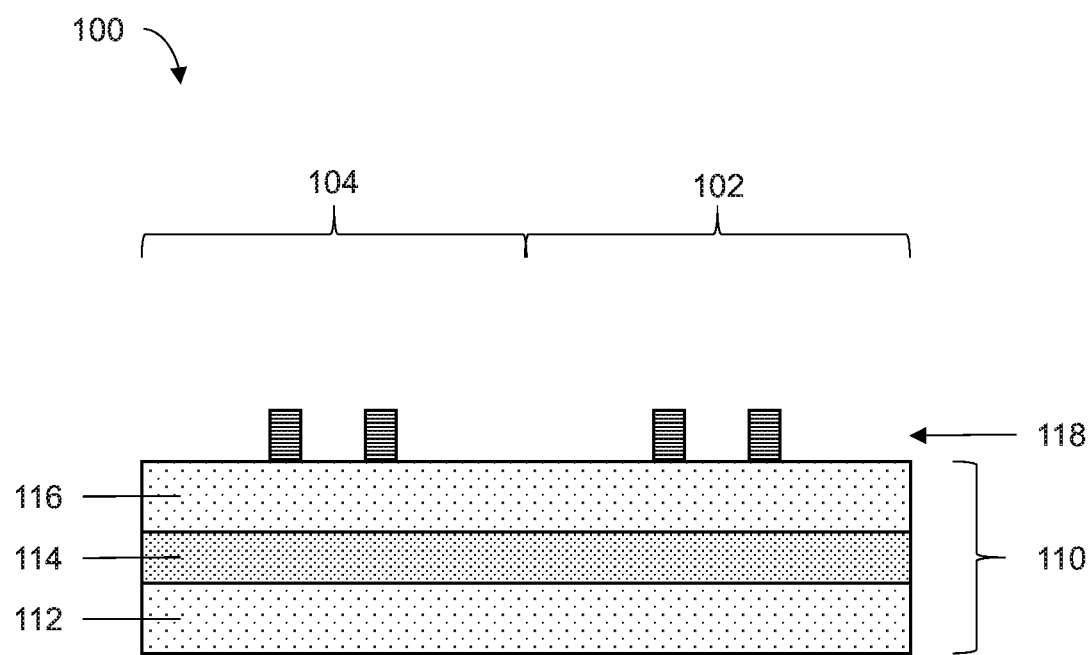
FIG. 1 is a cross-sectional view showing a semiconductor device including a bulk substrate with an etch masked formed thereon, in accordance with an embodiment of the present invention.

An embodiment of the present invention includes the formation of vertical tunnel field effect transistors (VTFETs) with a vertical fin profile including etching fins into a multilayered bulk substrate.

Accordingly, fins are etched into a bulk substrate through, e.g., a silicon germanium (SiGe) layer down to a base substrate including, e.g., silicon (Si). Selective source and drain growth can then be performed in each of a p-type and n-type field effect transistor (FET) region by oxidizing the SiGe layer. A sidewall spacer including, e.g., silicon nitride (SiN), can be selectively deposited on the fins.

To selectively grow source and drain regions in each of the p-type FET and the n-type FET, a first FET of the FETs can be blocked off with a block mask such as, e.g., an organic planarization layer (OPL). Thus, the hard mask can be removed from a second FET. The OPL and the oxidized layer of the SiGe can also be removed to uncover the second FET. As a result, source and drain regions can be grown in the region of the second FET.

A hardmask can be redeposited over the active regions and a block mask can be formed over the source and drain regions of the second FET. The hardmask and oxidized SiGe is selectively removed from the first FET without damaging the second FET. Accordingly, a source and drain region can be grown in a region of the first FET.

The source and drain regions can be grown to a level that covers a taper at a base of each of the fins. Thus, the grown source and drain regions provide a square bottom portion of the fins relative to the bulk substrate. As a result, source/drain and spacer modules can be effectively and efficiently formed down to bottoms of the fins.

Exemplary applications/uses to which the present invention can be applied include, but are not limited to: transistor devices such as field effect transistors for use in electronic processing devices, such as, e.g., computer processing units, graphical processing units, memory and storage devices, or any other electronic processing device.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a cross-sectional view showing a semiconductor device including a bulk substrate with an etch masked formed thereon is illustratively depicted according to an embodiment of the present invention.

According to aspects of the present invention, a semiconductor device 100 includes a substrate 110 having multiple layers formed thereon. The substrate 110 can include any suitable substrate structure, e.g., a bulk semiconductor, a semiconductor-on-insulator (SOI) substrate, etc. In one example, the substrate 110 can include a silicon-containing material. Illustrative examples of Si-containing materials suitable for the substrate 12 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

According to one possible embodiment of the present invention, the substrate 110 includes three layers; a base substrate 112, an intermediate layer 114 and a semiconductor layer 116. The base substrate 112 can include a suitable semiconductor material for forming a substrate, such as, e.g., Si, or other group IV, group III-V or group II-VI material, or any other suitable semiconductor material. Similarly, each of the intermediate layer 114 and the semiconductor layer 116 can include a suitable semiconductor material. However, the intermediate layer 114 and the semiconductor layer 116 include different materials for selective processing. Thus, the intermediate layer 114 can include, e.g., silicon germanium (SiGe), or other similar material, whereas the semiconductor layer 116 includes, e.g., Si. As such, etching and deposition can be performed selectively between the intermediate layer 114 and the semiconductor layer 116.

A hardmask 118 can be formed over the semiconductor layer 116 of the substrate 110. The hardmask 118 can have a pattern corresponding to a desired active region layout. For example, according to an embodiment of the present invention, the hardmask 118 can have a pattern corresponding to the active region of a processing or memory device. Thus, the hardmask 118 is patterned into two regions of the active region, a first region 102 and a second region 104. Thus, the semiconductor device 100 can include two regions, such as, e.g., an n-type region for n-type devices, and a p-type region for p-type devices.

To pattern the hardmask 118, e.g., photolithography, self-aligned double patterning (SADP), sidewall spacer image transfer (SIT), among other processes, can be used. For example, SADP or SIT processes can be employed whereby mandrels are patterned between fins using lithography. Sidewall spacers can then be deposited on sides of the mandrel, and the mandrel is removed to leave the hardmask 118 behind. Thus, a layer of hardmask material including, e.g., silicon oxide carbide (SiOC) or other suitable hardmask material, can be deposited over the semiconductor device 100. A photolithographic process can then be used to remove selected portions of the hardmask material, such that the hardmask 118 remains on the semiconductor layer 116.

To form the active region, fins 120 can be formed in each of the first region 102 and the second region 104. In one possible embodiment, two fins 120 are formed in each region 102 and 104 according to a pattern of the hardmask 118. In some embodiments, the fins 120 of the first region 102 can be formed for n-type field effect transistors (nFETs), while the fins 120 of the second region 104 can be formed for p-type field effect transistors (pFETs). However, other configurations and implementations of the fins 120 are contemplated.

To form the fins 120, the substrate 110 can be etched through the semiconductor layer 112 into the intermediate layer 114. Etching can be performed selective to the hardmask 118 using a suitable etch process, such as, e.g., an anisotropic etch process including wet etching or plasma etching. The etching process can be performed in one or more steps. For example, both the semiconductor layer 116 and the intermediate layer 114 can be concurrently etched with a common etching step selective to the hardmask 118. However, another possible embodiment can include etching the semiconductor layer 116 selective to the hardmask 118 down the intermediate layer 114 as a first step, and then as a second step, etching into the intermediate layer 114 selective to the hardmask 118 and the semiconductor layer 116.

Accordingly, due to the etching, fins 120 are formed, having a semiconductor fin 124 formed from the semiconductor material of the semiconductor layer 116. However, etching may not result in a square base profile. As a result, a taper can form at a bottom of the fins 120. The taper at the bottom makes spacer and source/drain formation difficult. As a result, the fins 120 are etched into the intermediate layer 114 such that the taper is formed entirely within a base portion 122 of each of the fins 120. As a result, the semiconductor fins 124 have vertical sidewalls with no taper.

The fins 120 can be etched down to the base substrate 112. However, according to aspects of the present embodiment, the fins 120 can be etched through a portion of the intermediate layer 114 such that a layer of material of the intermediate layer 114 remains on a top surface of the base substrate 112. Because the material remains on the surface of the base substrate 112, the material of the intermediate layer 114 can be later reformed by, e.g., epitaxial growth, using the remaining material as a seed layer.

Figure 2:
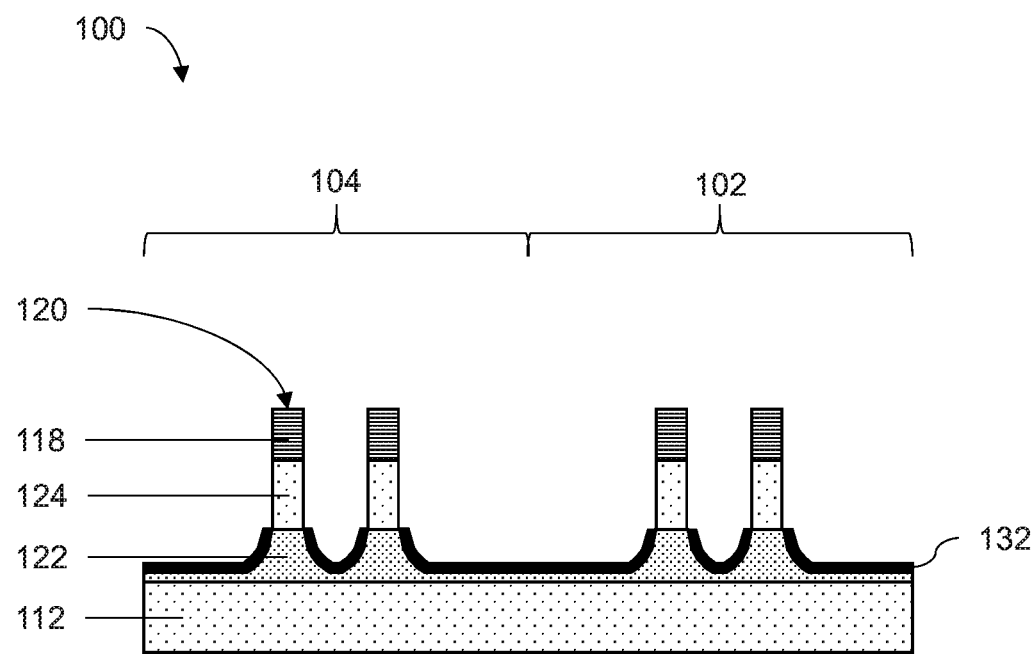
FIG. 2 is a cross-sectional view showing the semiconductor device of FIG. 1 with an oxide layer formed on a material of a layer of the bulk substrate and of fins, in accordance with an embodiment of the present invention.

Referring now to FIG. 2, a cross-sectional view of the semiconductor device of FIG. 1 with an oxide layer formed on a material of a layer of the bulk substrate and of fins is illustratively depicted according to an embodiment of the present invention.

The material of the base portion 122 can be prepared for later processing by forming an oxide layer 132 on the base portion 122. The oxide layer 132 can facilitate selective deposition and selective etching by forming an etch or deposition stop layer. Thus, the oxide layer 132 can be formed by, e.g., oxidizing the material of the base portion 122. For example, the base portion 122 can include, e.g., SiGe, which can be oxidized to form a SiGeO layer in a surface portion of the base portion 122. Alternatively, the oxide layer 132 can be formed by other techniques, such as, e.g., deposition.

The oxide layer 132 can be processed selective to the semiconductor fin 124 material, as well as other materials used in the semiconductor device 100. Alternatively, the oxide layer 132 can be a layer of another material that can be processed selective to the semiconductor fin 124 material, such as, e.g., a nitride, or other protective layer.

Figure 3:
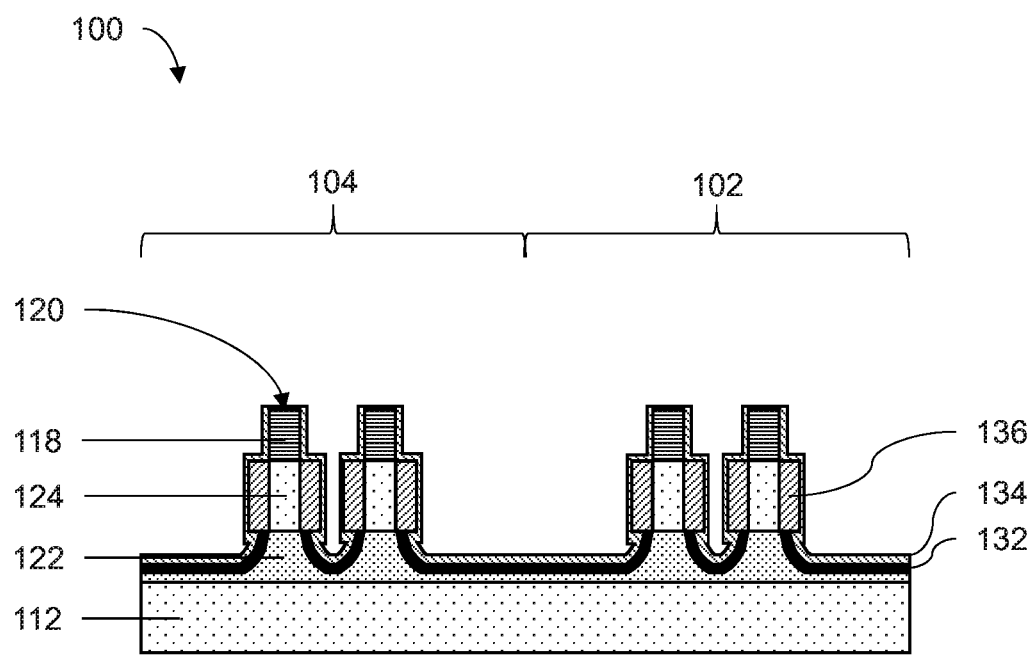
FIG. 3 is a cross-sectional view showing the semiconductor device of FIG. 2 with a sidewall spacer formed on sides of the fins and an etch mask formed over the semiconductor device, in accordance with an embodiment of the present invention.

Referring now to FIG. 3, a cross-sectional view of the semiconductor device of FIG. 3 with a hard mask formed on sides of the fins and an etch mask formed over the semiconductor device is illustratively depicted according to an embodiment of the present invention.

The semiconductor device 100 can be masked for selective processing. To protect underlying layers, such as, e.g., the base portion 122 and the semiconductor fins 124, a mask can be applied. The mask can include, e.g., silicon nitride (SiN).

According to an embodiment of the present invention, the mask can include two layers for selective processing of portions of the semiconductor device 100. For example, a fin mask 136 can be deposited on the semiconductor fins 124 by, e.g., selective deposition. Because the semiconductor fins 124 include a material different from the base portions 122, the selective deposition can be employed to form the fin mask only on the semiconductor fins 124 and not on the base portions 122. As a result, in subsequent processing, the base portions 122 can be processed without damaging the semiconductor fins 124.

Over the semiconductor device 100, including the sidewall spacer 136, a blanket mask 134 can be deposited. The blanket mask 134 forms an etch stop layer with, e.g., SiN, silicon boron carbide nitride (SiBCN), or other suitable etch stop material, over the semiconductor device 100. Accordingly, the blanket mask 134 can be conformally deposited via, e.g., chemical vapor deposition, plasma enhanced chemical vapor deposition, evaporation, atomic layer deposition or spin-on coating, among other deposition techniques. Thus, each of the first region 102 and the second region 104 can be protected from etching with the blanket mask 134.

According to one embodiment, the blanket mask 134 include a material different from the sidewall spacer 136 such that later removal of the blanket mask 134 can be performed selective to the fin masks 135 without damaging the fin masks 136. However, another possible embodiment can include sidewall spacer 136 including a same material as the blanket mask 134. As a result, later removal of the blanket mask 134 can be recessed to a sufficient amount to remove the material from the semiconductor device 100 without removing the sidewall spacer 136.

Figure 4:
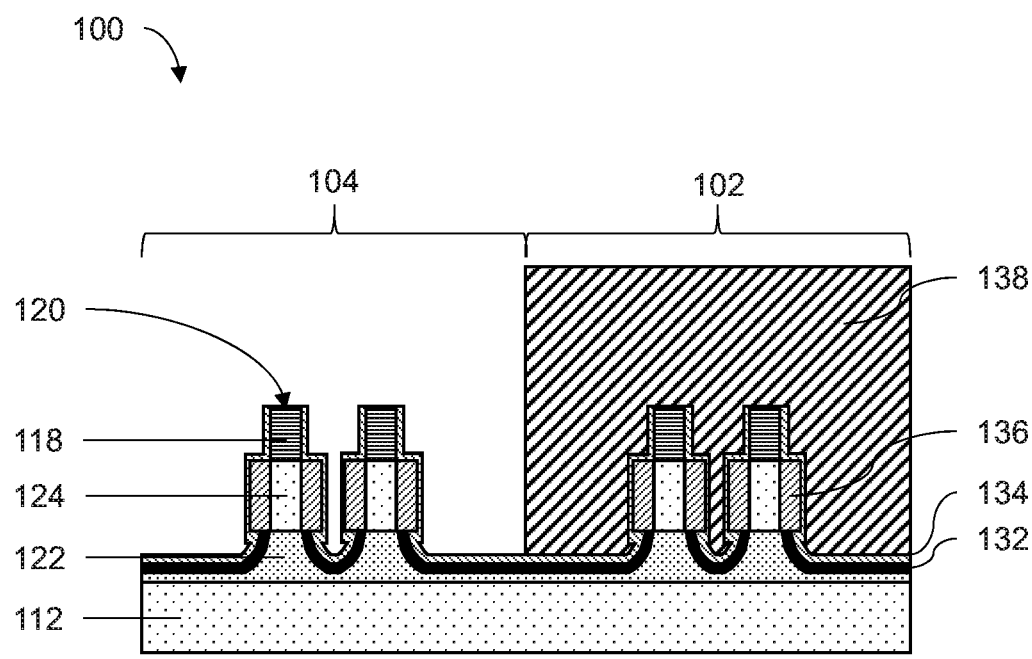
FIG. 4 is a cross-sectional view showing the semiconductor device of FIG. 3 with a block mask formed over a first region of the semiconductor device, in accordance with an embodiment of the present invention.

Referring now to FIG. 4, a cross-sectional view of the semiconductor device of FIG. 3 with a block mask formed over a first region of the semiconductor device is illustratively depicted according to an embodiment of the present invention.

According to aspects of the present invention, one of the first region 102 or the second region 104 can be processed selective to the other one of the first region 102 or second region 104. As such, the blanket mask 134 can be patterned to remove the etch stop from a selected one of the first or second regions 102 or 104.

To pattern the blanket mask 134, a block mask 138 can be formed in, e.g., the first region 102 of the semiconductor device 100. The block mask 138 can include, e.g., soft and/or hardmask materials and can be formed using deposition, photolithography and etching. In one embodiment, the block mask 138 is a mask composed of an organic material, such as an organic planarization layer (OPL). However, the composition of the hardmask may include any dielectric material that may be deposited by chemical vapor deposition (CVD) and related methods. Other hardmask compositions for the block mask 138 may include silicon nitrides, silicon oxides, silicon oxynitrides, silicon carbides, silicon carbonitrides, etc. Spin-on dielectrics may also be utilized as a hardmask material including, but not limited to: silsequioxanes, siloxanes, and boron phosphate silicate glass (BPSG).

In one embodiment, a block mask 138 comprising an OPL material may be formed by blanket depositing a layer of OPL material, providing a patterned photoresist atop the layer of OPL material, and then etching the layer of OPL material to provide a block mask 138 protecting at least one portion of the substrate 112, e.g., the first region 102 of the substrate 112. A patterned photoresist can be produced by applying a blanket photoresist layer to the surface of the substrate 112, exposing the photoresist layer to a pattern of radiation, and then developing the pattern into the photoresist layer utilizing resist developer. Etching of the exposed portion of the block mask 138 that is overlying the second device region 104 may include an etch chemistry for removing the exposed portion of the hardmask material and having a high selectivity to at least the block mask 138 that is present in the second device region 104. In one embodiment, the etch process may be an anisotropic etch process, such as reactive ion etch (RIE).

Figure 5:
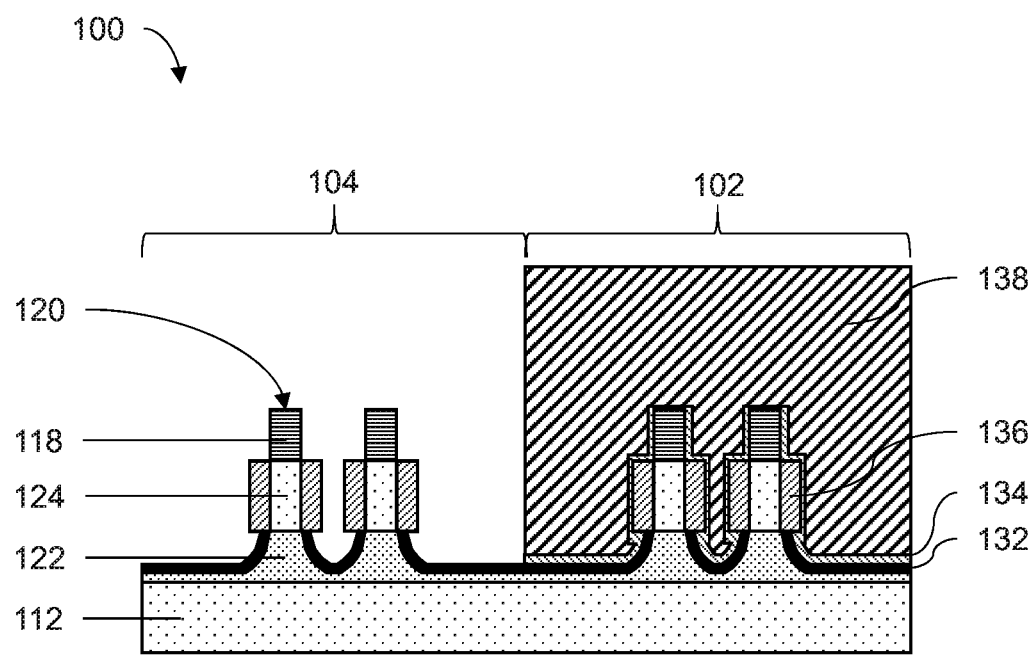
FIG. 5 is a cross-sectional view showing the semiconductor device of FIG. 4 with the etch mask removed from a second region not covered by the block mask on the semiconductor device, in accordance with an embodiment of the present invention.

Referring now to FIG. 5, a cross-sectional view of the semiconductor device of FIG. 4 with the etch mask removed from a second region not covered by the block mask on the semiconductor device is illustratively depicted according to an embodiment of the present invention.

To facilitate processing of the second region 104 of the semiconductor device 100, the blanket mask 134 can be removed in the second region 104. For example, an etch process can be used selective to the block mask 138. Because the block mask 138 is patterned to cover the first region 102 and expose the second region 104, the blanket mask 134 is removed by the etching in the second region 104, and not the first region 102.

Etching the blanket mask 134 can include, e.g., a suitable etch process, such as those described above. Thus, the fins 120 are exposed for processing. However, the etch process can recess the blanket mask 134 without removing the sidewall spacer 136. For example, because the sidewall spacer 136 are layered beneath the blanket mask 134, the blanket mask 134 can be recessed down to the sidewall spacer 136 without removing the fin sidewall spacer 136. Therefore, the oxide layer 132 and the hard mask 118 can be exposed without exposing the semiconductor fins 124.

Figure 6:
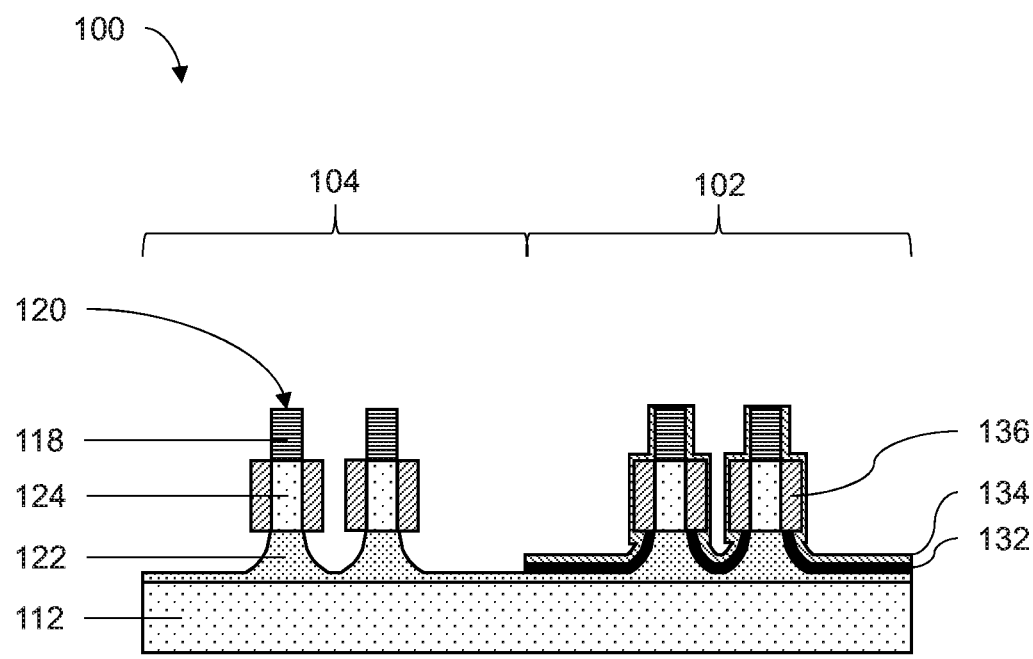
FIG. 6 is a cross-sectional view showing the semiconductor device of FIG. 5 with the block mask removed from the first region and the oxide layer selectively removed from the second region selective to the etch mask in the first region, in accordance with an embodiment of the present invention.

Referring now to FIG. 6, a cross-sectional view of the semiconductor device of FIG. 5 with the block mask removed from the first region and the oxide layer selectively removed from the second region selective to the etch mask in the first region is illustratively depicted according to an embodiment of the present invention.

The blanket mask 134 is present in the first region 102 but not in the second region 104. Thus, the second region 104 is exposed and can be processed selective to the blanket mask 134. Thus, according aspects of the present invention, the block mask 138 can be removed from the first region 102. The block mask 138 can be recessed selective to the oxide layer 132, hard mask 118 and sidewall spacer 136 of the second region 104. Thus, the first region 102 is exposed, while maintaining the blanket mask 134 for selective processing of the second region 104.

The base portions 122 of the second region 104 can be exposed selective to the first region 102. Because the blanket mask 134 is maintained in the first region 134, a material different from the oxide layer 132 is exposed in the first region 102. As such, using, e.g., an etch process that removes the oxide layer 132 removes the oxide layer 132 from the second region 104 without damage to the oxide layer 132 protected by the blanket mask 134 in the first region. Accordingly, the base portions 122 of the second region 104 is exposed.

Figure 7:
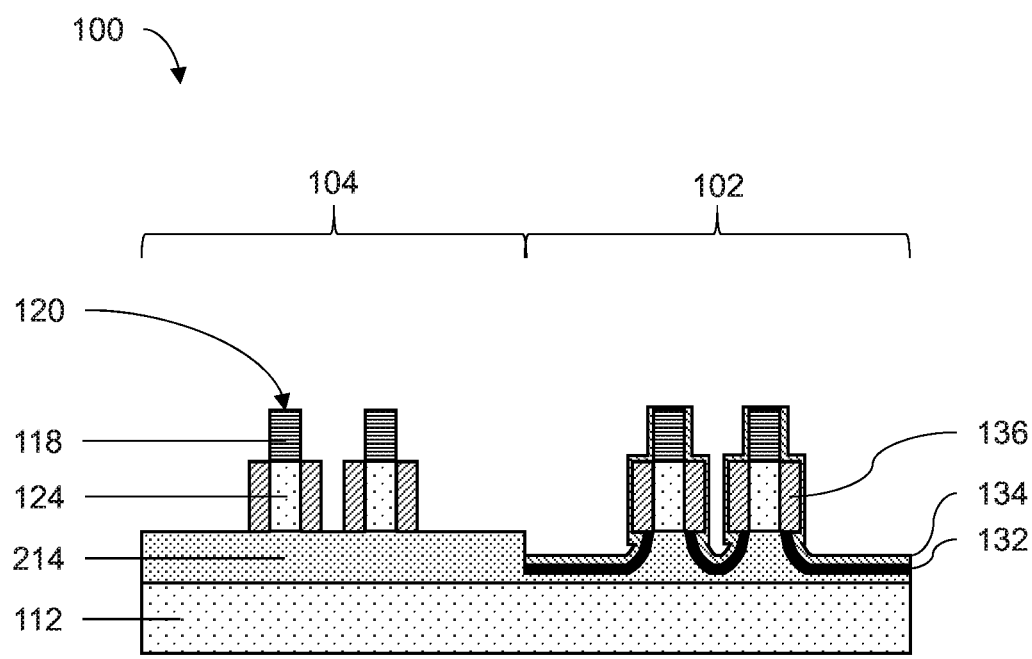
FIG. 7 is a cross-sectional view showing the semiconductor device of FIG. 6 with a source/drain region grown from material of bases of the fins and of the bulk substrate of the first region, in accordance with an embodiment of the present invention.

Referring now to FIG. 7, a cross-sectional view of the semiconductor device of FIG. 6 with a source/drain region grown from material of bases of the fins and of the bulk substrate of the first region is illustratively depicted according to an embodiment of the present invention.

With the base portions 122 being exposed on the second region 104 and masked by the blanket mask 134 in the first region 102, the second region 104 can be selectively processed. According to aspects of the present invention, processing can include the formation of a p-type semiconductor layer 214 in the second region 104. The p-type semiconductor layer 214 can include a material for a selected transistor type, such as, e.g., a p-type material. As such, the p-type semiconductor layer 214 can include, e.g., a p-type semiconductor such as, e.g., SiGe.

Indeed, the base portions 122, as described above, can be formed from the intermediate layer 114, including, e.g., SiGe or carbon doped silicon (Si:C). Therefore, the base portions 122 can be used as a seed for epitaxial growth of the p-type semiconductor layer 214. The p-type semiconductor layer 214 can be grown up to a level substantially coplanar with bottom surfaces to the fin masks 136. Accordingly, top surfaces of the base portions 122 are coplanar with the top surface of the p-type semiconductor layer 214.

S/D epitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial materials can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

Therefore, the fins 120 in the second region 104 can include a p-type semiconductor substrate for use in, e.g., p-type FETs (pFETs). Because the p-type semiconductor layer 214 is grown from beneath the semiconductor fins 124, thus restoring the intermediate layer 114 of the substrate 110, a top surface of the p-type semiconductor layer 214 is perpendicular to vertical sidewalls of each of the semiconductor fins 124 in the second region 104. Thus, the semiconductor fins 124 of the second region 104 are formed with a square base profile to facilitate better vertical spacer deposition and source/drain growth.

Figure 8:
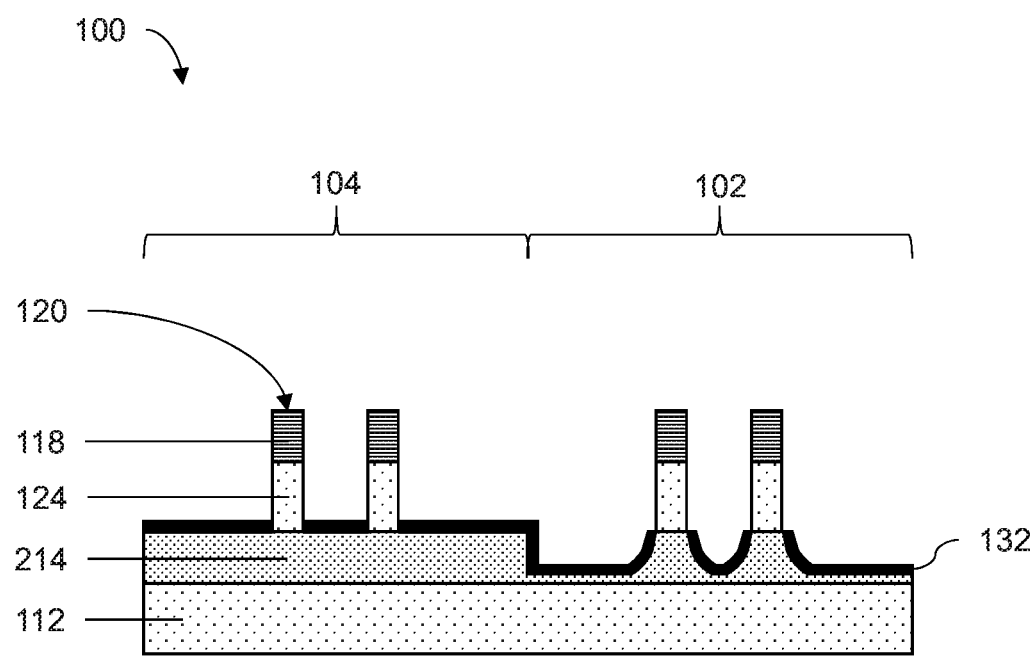
FIG. 8 is a cross-sectional view showing the semiconductor device of FIG. 7 with the remainder of the etch mask and the hard mask removed, and an oxide layer formed over the source/drain region, in accordance with an embodiment of the present invention.

Referring now to FIG. 8, a cross-sectional view of the semiconductor device of FIG. 7 with the remainder of the etch mask and the hard mask removed, and an oxide layer formed over the source/drain region is illustratively depicted according to an embodiment of the present invention.

Having formed the p-type semiconductor layer 214 in the second region 104, the semiconductor device 100 can be prepared for subsequent processing, such as, e.g., forming a semiconductor layer in the first region 102.

To prepare the semiconductor device 100 for processing of the first region 102, the fin masks 136 and the blanket mask 134 can be removed. To remove the fin masks 136 and the blanket mask 134, an etch process can be used selective to the material of the semiconductor fins 124, the hard mask 118, the oxide layer 132 and the p-type semiconductor layer 214. Therefore, the etch process can include a suitable isotropic or anisotropic etch process, such as those described above.

Accordingly, the sidewall spacer 136 and the blanket mask 134 can be stripped from the semiconductor device 100, exposing the p-type semiconductor layer 214 in both the first region 102 and the second region 104. As a result, portions of exposed p-type semiconductor layer 214, such as in the second region 104, can be oxidized again to reform the oxide layer 132 across the semiconductor device 100.

Figure 9:
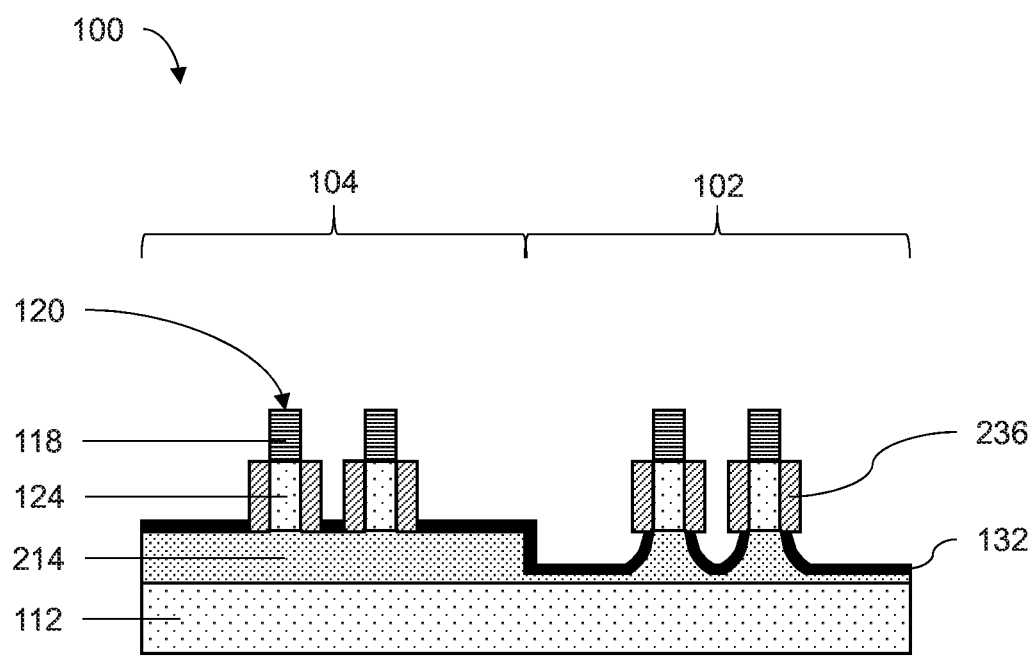
FIG. 9 is a cross-sectional view showing the semiconductor device of FIG. 8 having a sidewall spacer deposited on the fins, in accordance with an embodiment of the present invention.

Referring now to FIG. 9, a cross-sectional view of the semiconductor device of FIG. 8 having hard masks deposited on the fins is illustratively depicted according to an embodiment of the present invention.

The semiconductor fins 124 can be protected from processing to maintain undamaged vertical sidewalls. Thus, as described above, sidewall spacer 236 can be re-deposited on the semiconductor fins 124. The sidewall spacer 236 prevent subsequent processing, such as, e.g., deposition and etching, from altering the surfaces of the vertical sidewalls of the semiconductor fins 124. As a result, the semiconductor fins 124 can be protected to facilitate uniform and undamaged semiconductor fins 124. Thus, the semiconductor device 100 can be more efficiently and effectively manufactured with fewer defects and more reliable operation.

Figure 10:
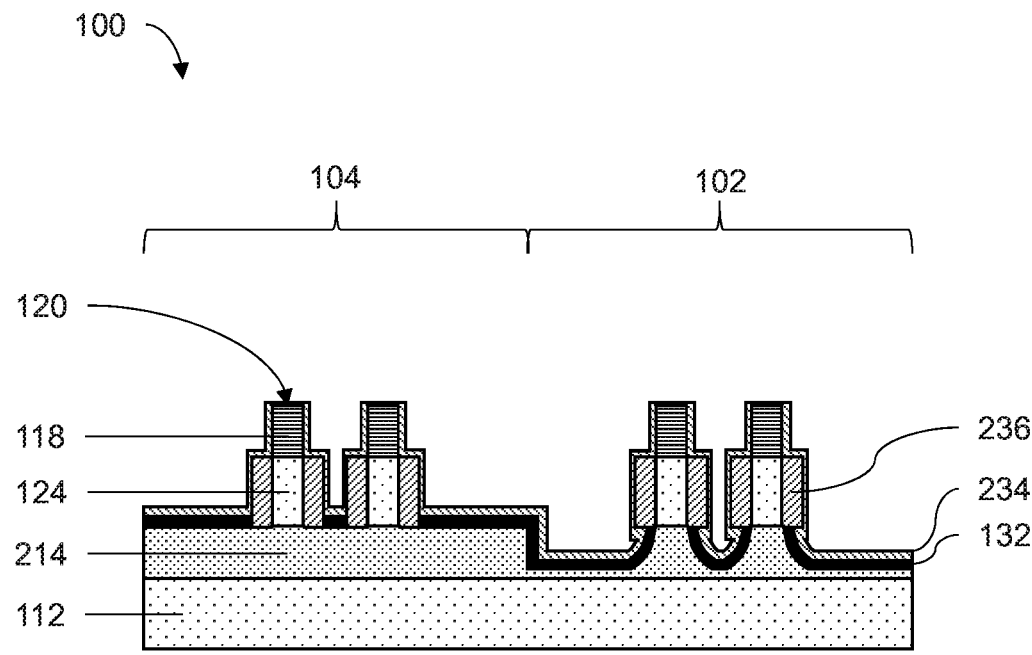
FIG. 10 is a cross-sectional view showing the semiconductor device of FIG. 9 having an etch mask grown over the semiconductor device, in accordance with an embodiment of the present invention.

Referring now to FIG. 10, a cross-sectional view of the semiconductor device of FIG. 9 having an etch mask grown over the semiconductor device is illustratively depicted according to an embodiment of the present invention.

Similar to FIG. 3 above, the semiconductor device 100 can be masked for selective processing. To protect underlying layers, such as, e.g., the p-type semiconductor layer 214 and the semiconductor fins 124, a mask can be applied. The mask can include, e.g., silicon nitride (SiN).

Over the semiconductor device 100, including the sidewall spacer 236, a blanket mask 234 can be deposited. The blanket mask 234 forms an etch stop layer with, e.g., SiN, over the semiconductor device 100. Accordingly, the blanket mask 234 can be conformally deposited via, e.g., chemical vapor deposition, plasma enhanced chemical vapor deposition, evaporation, atomic layer deposition or spin-on coating, among other deposition techniques. Thus, each of the first region 102 and the second region 104 can be protected from etching with the blanket mask 234.

Figure 11:
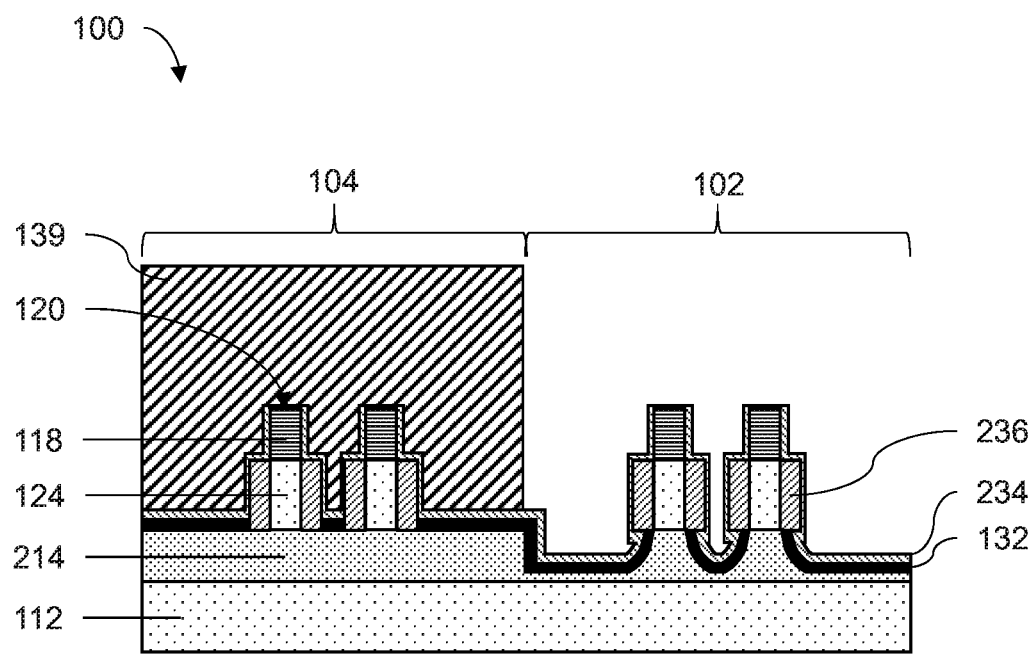
FIG. 11 is a cross-sectional view showing the semiconductor device of FIG. 10 having a block mask formed over the second region, in accordance with an embodiment of the present invention.

Referring now to FIG. 11, a cross-sectional view of the semiconductor device of FIG. 10 having a block mask formed over the second region is illustratively depicted according to an embodiment of the present invention.

According to aspects of the present invention, one of the first region 102 or the second region 104 can be processed selective to the other one of the first region 102 or second region 104. As such, the blanket mask 134 can be patterned to remove the etch stop from a selected one of the first or second regions 102 or 104.

To pattern the blanket mask 234, a block mask 139 can be formed in, e.g., the second region 104 of the semiconductor device 100. The block mask 139 can include, e.g., soft and/or hardmask materials and can be formed using deposition, photolithography and etching. In one embodiment, the block mask 139 is a mask composed of an organic material, such as an organic planarization layer (OPL). However, the composition of the hardmask may include any dielectric material that may be deposited by chemical vapor deposition (CVD) and related methods. Other hardmask compositions for the block mask 139 may include silicon nitrides, silicon oxides, silicon oxynitrides, silicon carbides, silicon carbonitrides, etc. Spin-on dielectrics may also be utilized as a hardmask material including, but not limited to: silsequioxanes, siloxanes, and boron phosphate silicate glass (BPSG).

In one embodiment, a block mask 139 including an OPL material may be formed by blanket depositing a layer of OPL material, providing a patterned photoresist atop the layer of OPL material, and then etching the layer of OPL material to provide a block mask 139 protecting at least one portion of the substrate 112, e.g., the second region 104 of the substrate 112. A patterned photoresist can be produced by applying a blanket photoresist layer to the surface of the substrate 112, exposing the photoresist layer to a pattern of radiation, and then developing the pattern into the photoresist layer utilizing resist developer. Etching of the exposed portion of the block mask 139 that is overlying the first device region 102 may include an etch chemistry for removing the exposed portion of the hardmask material and having a high selectivity to at least the block mask 139 that is present in the first region 102. In one embodiment, the etch process may be an anisotropic etch process, such as reactive ion etch (RIE).

Figure 12:
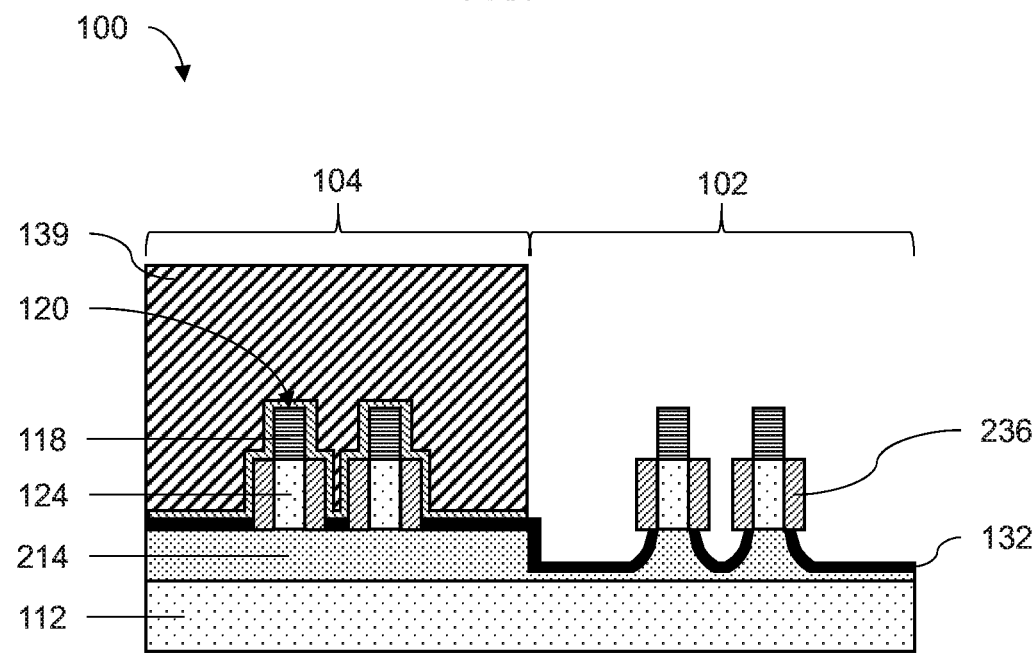
FIG. 12 is a cross-sectional view showing the semiconductor device of FIG. 11 having the etch mask removed from the first region selective to the block mask in the second region, in accordance with an embodiment of the present invention.

Referring now to FIG. 12, a cross-sectional view of the semiconductor device of FIG. 11 having the etch mask remove from the first region selective to the block mask in the second region is illustratively depicted according to an embodiment of the present invention.

Similar to processing of the second region 104, the blanket mask 234 can be removed in unmasked regions including the first region 102. For example, an etch process can be used selective to the block mask 139. Because the block mask 139 is patterned to cover the second region 104 and expose the first region 102, the blanket mask 234 is removed by the etching in the first region 102, and not the second region 104.

The etch process can recess the blanket mask 234 without removing the sidewall spacer 236. For example, because the sidewall spacer 236 are layered beneath the blanket mask 234, the blanket mask 234 can be recessed down to the sidewall spacer 236 without removing the sidewall spacer 236. Therefore, the oxide layer 132 and the hard mask 118 can be exposed without exposing the semiconductor fins 124.

Figure 13:
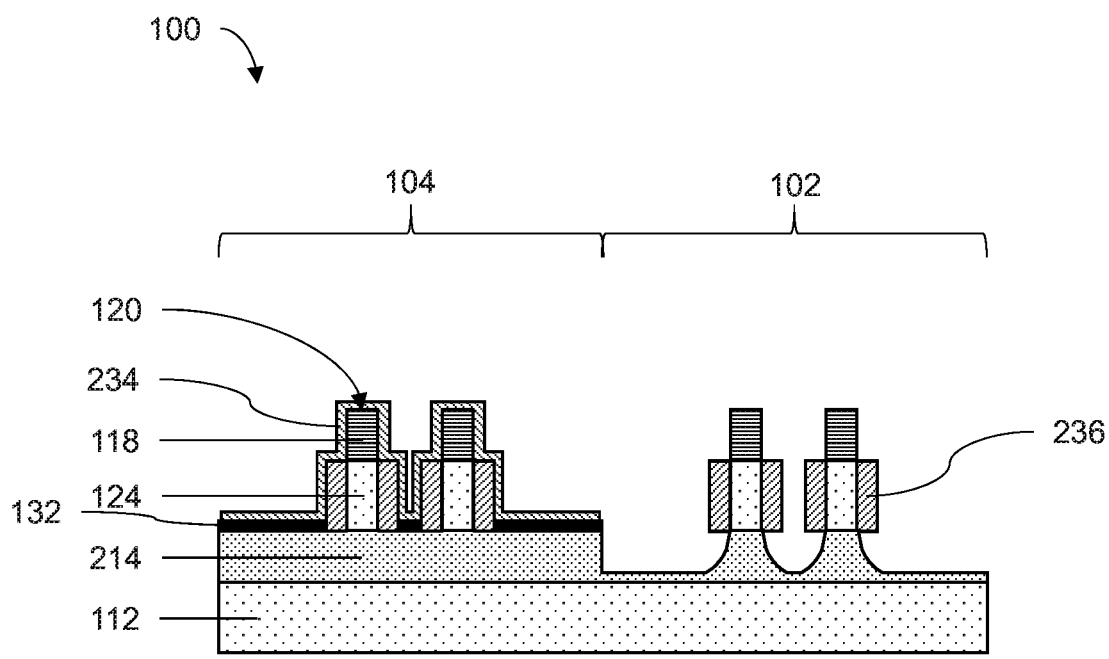
FIG. 13 is a cross-sectional view showing the semiconductor device of F FIG. 12 with the block mask selectively removed from the second region and the oxide layer selectively removed from the first region, selective to the etch mask in the second region, in accordance with an embodiment of the present invention.

Referring now to FIG. 13, a cross-sectional view of the semiconductor device of FIG. 12 with the block mask selectively removed from the second region and the oxide layer selectively removed from the first region is illustratively depicted according to an embodiment of the present invention.

The blanket mask 234 is present in the second region 104 but not in the first region 102. Thus, the first region 102 is exposed and can be processed selective to the blanket mask 234. Thus, according aspects of the present invention, the block mask 139 can be removed from the second region 104. The block mask 139 can be recessed selective to the oxide layer 132, hard mask 118 and sidewall spacer 236 of the first region 102. Thus, the second region 104 is exposed, while maintaining the blanket mask 234 for selective processing of the first region 102.

The p-type semiconductor layer 214 in the first region 102, forming tapered base portions for the fins 120 in the first region 102, can be exposed selective to the second region 104. Because the blanket mask 234 is maintained in the second region 104, an etch process can remove the oxide layer 132 from the first region 102 without damage to the oxide layer 132 protected by the blanket mask 234 in the second region 104. Accordingly, the first region 102 is exposed.

Figure 14:
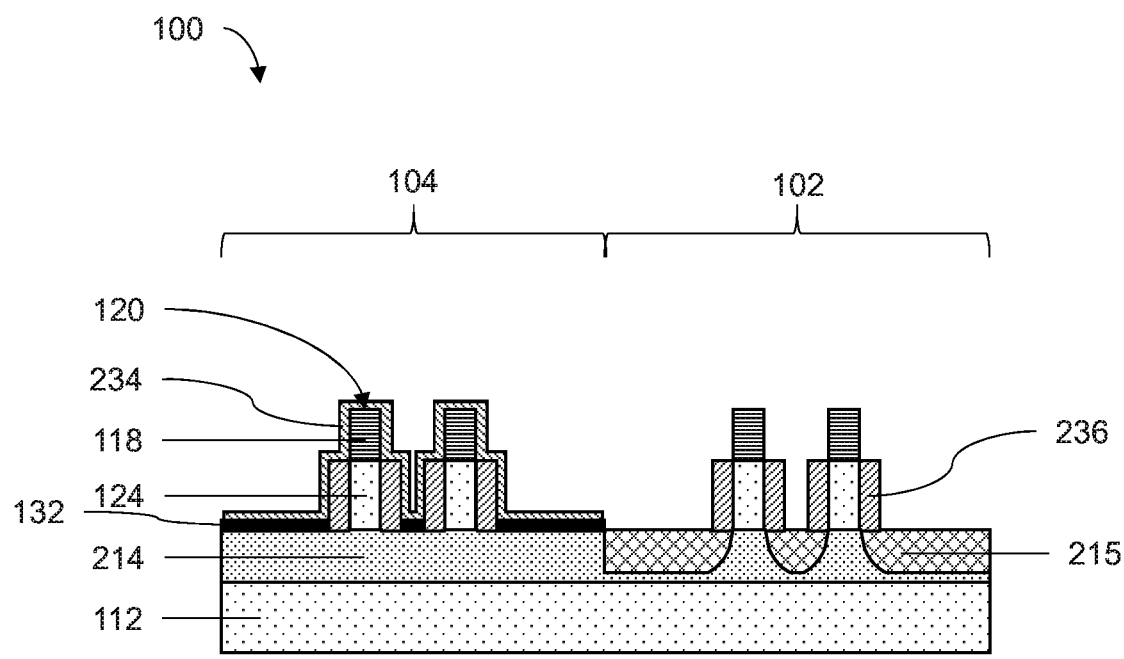
FIG. 14 is a cross-sectional view showing the semiconductor device of FIG. 13 having a source/drain region grown in the first region with a different material than the source/drain region of the second region, in accordance with an embodiment of the present invention.

Referring now to FIG. 14, a cross-sectional view of the semiconductor device of FIG. 13 having a source/drain region grown in the first region with a different material than the source/drain region of the second region is illustratively depicted according to an embodiment of the present invention.

With the base portions of the fins 120 in the first region 102 being exposed, the first region 102 can be selectively processed. According to aspects of the present invention, processing can include the formation of a n-type semiconductor layer 215 in the first region 102 around the base portions of the fins 120. The n-type semiconductor layer 215 can include a material for a selected transistor type, such as, e.g., a n-type material. As such, the n-type semiconductor layer 215 can include, e.g., a n-type semiconductor such as, e.g., SiGe doped with n-type dopants, including, e.g., Group V dopants such as, e.g., phosphorus, arsenic, antimony, bismuth, lithium, among others.

Similar to the p-type semiconductor 214, the n-type semiconductor layer 215 can be grown from the base portions of the fins 120, which includes a material from the intermediate layer 114. Accordingly, the base portions can include, e.g., SiGe, and provide a seed layer for the n-type semiconductor layer 215. For example, the n-type semiconductor layer 215 can be, e.g., epitaxial grown. The n-type semiconductor layer 215 is grown up to bottoms of the fin masks 236 and an interface between the semiconductor fins 124 and the respective base portions. Thus, a top surface of the n-type semiconductor layer 215 is substantially coplanar with the p-type semiconductor layer 214.

To provide the dopants for the n-type semiconductor layer 215, a suitable doping processing can be used for inserting the dopants into the material of the n-type semiconductor layer 215. For example, dopants can be provided by, e.g., in-situ doping, ion implantation, plasma doping, gas phase diffusion, diffusion from a doped oxide, or combinations thereof.

Therefore, the fins 120 in the first region 102 can include a n-type semiconductor substrate for use in, e.g., n-type FETs (nFETs). Because the n-type semiconductor layer 215 is grown from beneath the semiconductor fins 124, a top surface of the n-type semiconductor layer 214 is perpendicular to vertical sidewalls of each of the semiconductor fins 124 in the first region 102. Thus, the semiconductor fins 124 of the first region 102 are formed with a square base profile to facilitate better vertical spacer deposition and source/drain growth.

Figure 15:
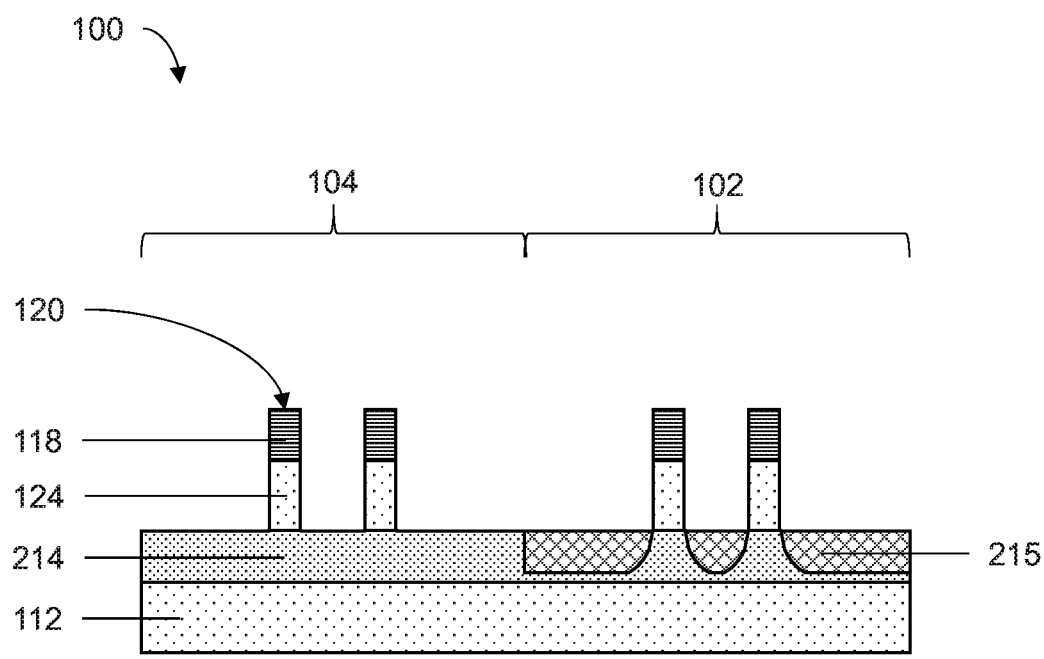
FIG. 15 is a cross-sectional view showing the semiconductor device of FIG. 14 having the etch mask, hard mask and remainder of the oxide layer removed, in accordance with an embodiment of the present invention.

Referring now to FIG. 15, a cross-sectional view of the semiconductor device of FIG. 14 having the etch mask, hard mask and remainder of the oxide layer removed is illustratively depicted according to an embodiment of the present invention.

Having formed the n-type semiconductor layer 215 in the first region 102, the semiconductor device 100 can be prepared for subsequent processing, such as, e.g., forming gates across the fins 120.

To prepare the semiconductor device 100 for processing, the sidewall spacer 236 and the blanket mask 234 can be removed. To remove the sidewall spacer 236 and the blanket mask 234, an etch process can be used selective to the material of the semiconductor fins 124, the hard mask 118, the oxide layer 132 and the p-type and n-type semiconductor layers 214 and 215. Therefore, the etch process can include a suitable isotropic or anisotropic etch process, such as those described above.

Accordingly, the sidewall spacer 136 and the blanket mask 134 can be stripped from the semiconductor device 100, exposing the p-type semiconductor layer 214 in the second region 104 and n-type semiconductor layer 215 in the first region 102.

The oxide layer 132 can similarly be stripped using, e.g., a selective etch process. As a result, the semiconductor fins 120 can be exposed with square base profiles relative to the n-type and p-type semiconductor layers 214 and 215.

Figure 16:
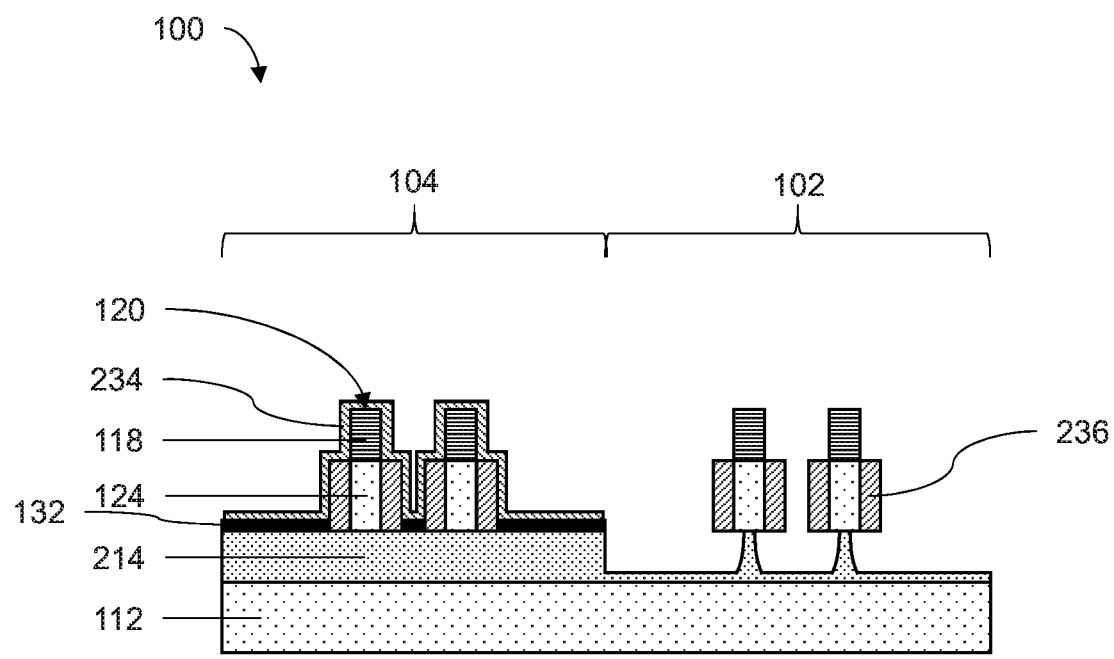
FIG. 16 is a cross-sectional view showing the semiconductor device of FIG. 13 having bases of the fins in the first region recessed below the hard mask to form a narrow base portion of each fin, in accordance with an embodiment of the present invention.

Referring now to FIG. 16, a cross-sectional view of the semiconductor device of FIG. 13 having bases of the fins in the first region recessed below the hard mask to form a narrow base portion of each fin is illustratively depicted according to an embodiment of the present invention.

As described above, a n-type semiconductor layer 215 can be formed under semiconductor fins 124 such that the sidewalls of the semiconductor fins 124 and the top surface of the n-type semiconductor layer 215 form a square profile with right angles. However, p-type base portions are present directly beneath the semiconductor fins 124. Therefore, according to aspects of the present invention, electrical characteristics can be improved for the fins 120 in the first region 102 by reducing the size of the base portions in the first region 102.

Similar to the semiconductor device 100 as described with reference to FIG. 13, a series of selective etch processes can be employed to remove the block mask 139 and the oxide layer 132 to expose the base portions of the fins 120 in the first region 102. However, an additional step can be employed to recess material of the base portions beneath the semiconductor fins 124 in the first region 102. Thus, the base portions can be recessed using a selective etch process, such as, e.g., a suitable isotropic or anisotropic etch process as described above. The etch process is selective to the blanket mask 234 of the second region 104. Accordingly, the base portions beneath the semiconductor fins 124 in the first region 102 can be thinned to reduce the amount of p-type material in the first region 102.

Figure 17:
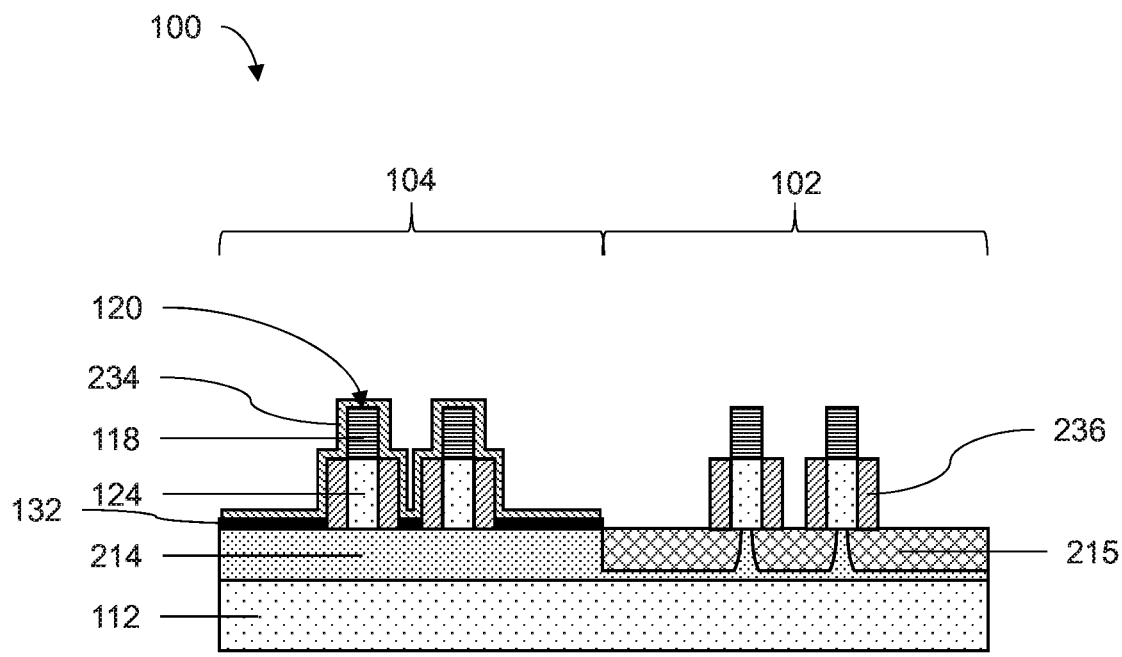
FIG. 17 is a cross-sectional view showing the semiconductor device of FIG. 16 having a source/drain region grown in the first region around the narrow base portions with a different material than the source/drain region of the second region, in accordance with an embodiment of the present invention.
Figure 18:
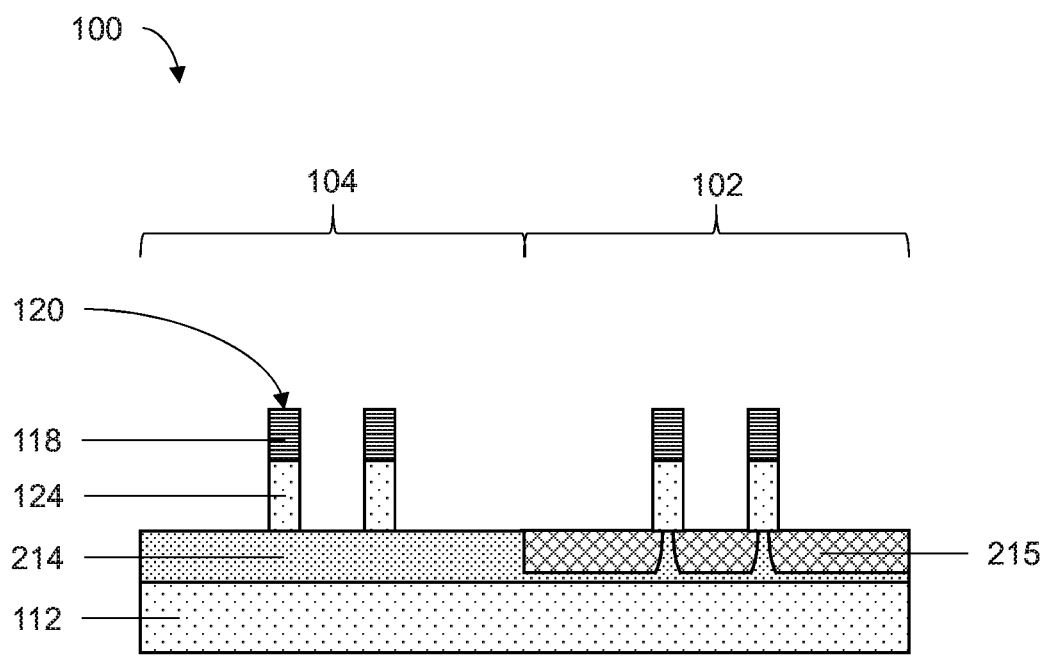
FIG. 18 is a cross-sectional view showing the semiconductor device of FIG. 17 having the etch mask, hard mask and remainder of the oxide layer removed, in accordance with an embodiment of the present invention.

Referring now to FIG. 17, a cross-sectional view of the semiconductor device of FIG. 16 having a source/drain region grown in the first region around the narrow base portions with a different material than the source/drain region of the second region is illustratively depicted according to an embodiment of the present invention.

As described with respect to FIG. 14, the n-type semiconductor layer 215 can be grown in the first region 102 around the base portions of the fins 120. Because the base portions had been thinned beneath the semiconductor fins 124, n-type material can be filled in beneath the semiconductor fins 124 using epitaxy, as described above. Thus, the fins 120 can more efficiently and effectively form nFETs by exhibiting more consistent and reliable n-type characteristics.

Referring now to FIG. 21, a cross-sectional view of the semiconductor device of FIG. 20 having the etch mask, hard mask and remainder of the oxide layer removed is illustratively depicted according to an embodiment of the present invention.

To prepare the semiconductor device 100 for processing, the sidewall spacer 236 and the blanket mask 234 can be removed. To remove the sidewall spacer 236 and the blanket mask 234, an etch process can be used selective to the material of the semiconductor fins 124, the hard mask 118, the oxide layer 132 and the p-type and n-type semiconductor layers 214 and 215. Therefore, the etch process can include a suitable isotropic or anisotropic etch process, such as those described above.

Accordingly, the sidewall spacer 136 and the blanket mask 134 can be stripped from the semiconductor device 100, exposing the p-type semiconductor layer 214 in the second region 104 and n-type semiconductor layer 215 in the first region 102.

The oxide layer 132 can similarly be stripped using, e.g., a selective etch process. As a result, the semiconductor fins 120 can be exposed with square base profiles relative to the n-type and p-type semiconductor layers 214 and 215.

Figure 19:
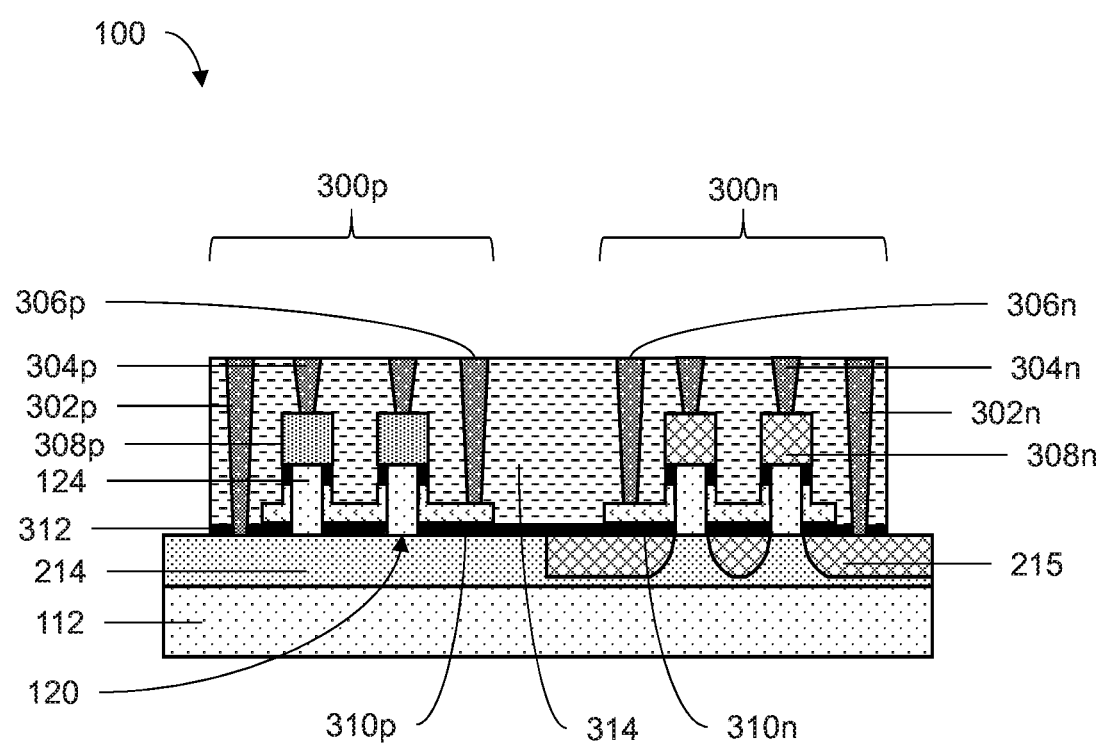
FIG. 19 is a cross-sectional view showing the semiconductor device of FIG. 15 having a gate structure formed over the fins, in accordance with to an embodiment of the present invention.

Referring now to FIG. 19, a cross-sectional view of the semiconductor device of FIG. 15 having a gate structure formed over the fins is illustratively depicted according to an embodiment of the present invention.

Gate structures 300n and 300p can be formed in the first region 102 and second region 104, respectively, using deposition, photolithography and a selective etching process. Specifically, a pattern is produced by applying a photoresist to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions.

In one embodiment, the hardmask 118 can be removed, e.g., via an etch process, and semiconductor caps 308n and 308p can be epitaxially grown over the semiconductor fins 124 in each of the first region and second region respectively. Thus, the semiconductor caps 308n and 308p can form source/drain regions on top of the semiconductor fins 124, which the n-type and p-type semiconductor layers 215 and 214, respectively, form source/drain regions below the semiconductor fins 124.

A dielectric layer 312 can be conformally deposited over the semiconductor device 100 using, e.g., atom layer deposition (ALD) or other conformal deposition process. First and second gate electrodes 310n and 310p can be formed on each of the n-type gate structure 300n and the p-type gate structure 300p, respectively. To do so, a portion of the dielectric layer 312 on sides of each of the fins 120 can be selectively removed, and the gate electrodes 310n and 310p deposited around the fins 120 to contact the semiconductor fins 124.

The gate electrode 310n and 310p material may be any conductive metal including, but not limited to W, Ni, Ti, Mo, Ta, Cu, Pt, Ag, Au, Ru, Ir, Rh, and Re, and alloys that include at least one of the aforementioned conductive elemental metals. In one example, the gate electrode 310n and 310p material may be a doped semiconductor material, such as a doped silicon containing material, e.g., doped polysilicon. When a combination of conductive elements is employed, an optional diffusion barrier material such as TaN or WN may be formed between the conductive materials. The gate conductor 310p and 310n of each of the gate structures 300n and 300p is typically present on the dielectric layer 312. The dielectric layer 312 may be a dielectric material, such as $SiO_2$, or alternatively high-k dielectrics, such as oxides of Ta, Zr, Al or combinations thereof. In another embodiment, the dielectric layer 312 is comprised of an oxide, such as $SiO_2$, $ZrO_2$, $Ta_2O_5$ or $Al_2O_3$. In one embodiment, the dielectric layer 312 has a thickness ranging from 1 nm to 10 nm. In another embodiment, the dielectric layer 312 has a thickness ranging from 1.5 nm to 2.5 nm.

The semiconductor device 100 can then be buried in an interlevel dielectric (ILD) 314. The ILD 314 isolates each fin 120 from each other fin 120. Optionally, though not shown, the ILD 314 can extend below the n-type and p-type semiconductor layer 215 and 214 to form a shallow trench isolation (STI) region separating the n-type gate structure 300n from the p-type gate structure 300p.

Contacts 302n, 302p, 304n, 304p, 306n and 306p can then be formed by opening vias through the ILD 314. A via can be opened up down to the n-type semiconductor layer 215 and another down to the p-type semiconductor layer 214 and filled with the conductive material to form bottom contacts 302n and 302p, respectively. Similarly, vias can be opened up down to each of the semiconductor caps 308n and 308p and filled with conductive material to form top contacts 304n and 304p, respectively. Additionally, a via can be opened up down to each of the gate electrodes 310n and 310p to form gate contacts 306n and 306p, respectively. The conductive material can be any conductive material, such as those described above.

Referring now to FIG. 20, a block/flow diagram of a system/method of forming a semiconductor device with vertical fin profiles is illustratively depicted according to an embodiment of the present invention.

At block 2001, fins are etched into a bulk substrate in an active region, the active region including a first region and a second region, the bulk substrate including an intermediate layer formed over a base layer and a semiconductor layer formed over the intermediate layer such that the fins extend through the semiconductor layer into the intermediate layer to form tapered bottom portions of the fins within the intermediate layer and vertical fin sidewalls of a semiconductor portions of the fins within the semiconductor layer.

At block 2002, a second semiconductor layer is grown from the tapered bottom portions below the semiconductor portions of the fins in the first region.

At block 2003, a third semiconductor layer is grown from the tapered bottom portions below the semiconductor portions of the fins in the second region such that the first semiconductor layer and the second semiconductor layer have respective top surfaces proximal to the semiconductor portions of the fins that is substantially parallel to a top surface of the base layer.

At block 2004, a first gate structure is formed over the fins in the first region to form first field effect transistors (FET).

At block 2005, a second gate structure is formed over the fins in the second region to form second FETs.

Having described preferred embodiments of a system and method formation of VTFET fin and vertical fin profile (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims:

The invention claimed is:

1. A method for forming a semiconductor device, comprising:
   etching fins into a bulk substrate in an active region, the bulk substrate including an intermediate layer formed over a base layer and a first semiconductor layer formed over the intermediate layer such that the fins extend through the first semiconductor layer into the intermediate layer to form tapered bottom portions of the fins within the intermediate layer and vertical fin sidewalls of a semiconductor portions of the fins within the first semiconductor layer; and
   forming a second semiconductor layer around the tapered bottom portions below the semiconductor portions of the fins such that the second semiconductor layer covers the tapered bottom portions to form a top surface proximal to the semiconductor portions of the fins that is substantially parallel to a bottom surface of the top surface of the base layer; and
   forming a gate structure over the fins.

2. The method as recited in claim 1, wherein growing the second semiconductor layer includes:
   growing a first semiconductor material below the semiconductor portions of the fins in a first region to form a p-type semiconductor layer beneath the fins in the first region; and
   growing a second semiconductor material below the semiconductor portions of the fins in a second region to form a n-type semiconductor layer beneath the fins in the second region such that the p-type semiconductor layer and the n-type semiconductor layer have respective top surfaces that are coplanar and form a square profile relative to each of the vertical fin sidewalls.

3. The method as recited in claim 1, wherein forming the gate structure includes:
   forming a first gate structure over fins in a first region to form first field effect transistors (FET); and
   forming a second gate structure over fins in a second region to form second FETs.

4. The method as recited in claim 3, wherein the first FETs are p-type FETs (pFETs) and the second FETs are n-type FETs (nFETs).

5. The method as recited in claim 1, wherein the intermediate layer includes silicon germanium (SiGe).

6. The method as recited in claim 1, further including recessing the tapered bottom portions of the fins to be narrower than the semiconductor portions of the fins.

7. The method as recited in claim 1, further including doping the semiconductor material.

8. The method as recited in claim 1, further including:
   masking a first region of the active region with a mask;
   epitaxially growing a first semiconductor material from the tapered bottom portions in the first region;
   removing the mask from the first region;
   masking a second region of the active region with a second mask; and
   epitaxially growing a second semiconductor material from the tapered bottom portions in the second region.

9. The method as recited in claim 8, wherein the first region and the second region are adjacent.

10. A method for forming a semiconductor device, comprising:
    etching fins into a bulk substrate in an active region, the active region including a first region and a second region, the bulk substrate including an intermediate layer formed over a base layer and a first semiconductor layer formed over the intermediate layer such that the fins extend through the first semiconductor layer into the intermediate layer to form tapered bottom portions of the fins within the intermediate layer and vertical fin sidewalls of a semiconductor portions of the fins within the first semiconductor layer;
    growing a second semiconductor layer from the tapered bottom portions below the semiconductor portions of the fins in the first region;
    growing a third semiconductor layer from the tapered bottom portions below the semiconductor portions of the fins in the second region such that the first semiconductor layer and the second semiconductor layer have respective top surfaces proximal to the semiconductor portions of the fins that is substantially parallel to a top surface of the base layer;
    forming a first gate structure over the fins in the first region to form first field effect transistors (FET); and
    forming a second gate structure over the fins in the second region to form second FETs.

11. The method as recited in claim 10, wherein the first FETs are p-type FETs (pFETs) and the second FETs are n-type FETs (nFETs).

12. The method as recited in claim 10, wherein the intermediate layer includes silicon germanium (SiGe).

13. The method as recited in claim 10, further including recessing the tapered bottom portions of the fins to be narrower than the semiconductor portions of the fins.

14. The method as recited in claim 10, further including doping the second semiconductor layer with n-type dopants.

15. The method as recited in claim 10, further including:
    masking the first region of the active region with a mask;
    epitaxially growing the first semiconductor layer from the tapered bottom portions in the first region;
    removing the mask from the first region;
    masking the second region of the active region with a second mask; and
    epitaxially growing the third semiconductor layer from the tapered bottom portions in the second region.

16. The method as recited in claim 15, wherein the first region and the second region are adjacent.

\* \* \* \* \*